United States Patent
Huang

(10) Patent No.: US 7,550,803 B1
(45) Date of Patent: Jun. 23, 2009

(54) VERTICAL DOUBLE-DIFFUSION METAL-OXIDE-SEMICONDUCTOR TRANSISTOR DEVICE

(75) Inventor: Chun-Yao Huang, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/102,871

(22) Filed: Apr. 15, 2008

(51) Int. Cl.
  *H01L 29/78* (2006.01)
(52) U.S. Cl. .............. 257/330; 257/335; 257/336; 257/E29.258
(58) Field of Classification Search ............. 257/330, 257/335, 336, E29.066, E29.258
See application file for complete search history.

(56) References Cited

U.S. PATENT DOCUMENTS

| 5,723,891 | A | * | 3/1998 | Malhi | 257/341 |
| 7,352,036 | B2 | * | 4/2008 | Grebs et al. | 257/401 |
| 2007/0164353 | A1 | | 7/2007 | Mifuji et al. | |
| 2008/0128801 | A1 | * | 6/2008 | Izumi | 257/330 |

* cited by examiner

*Primary Examiner*—Trung Dang
(74) *Attorney, Agent, or Firm*—Winston Hsu

(57) ABSTRACT

A vertical double-diffusion metal-oxide-semiconductor (VDMOS) transistor device includes a first conductive type semiconductor substrate, a gate structure formed in a first trench in the first conductive type semiconductor substrate, a first conductive type well surrounding the gate structure, a source region adjacent to the gate structure formed in the first conductive type well, a drain region surrounding the source region, and a trench isolation structure formed in a second trench between the source region and the drain region.

13 Claims, 1 Drawing Sheet

VERTICAL DOUBLE-DIFFUSION METAL-OXIDE-SEMICONDUCTOR TRANSISTOR DEVICE

BACKGROUND OF THE INVENTION

1. Field of the Invention

The invention relates to a double diffused drain metal-oxide semiconductor (MOS) transistor device, more particularly, to a vertical double-diffusion MOS transistor device.

2. Description of the Prior Art

With improvement in semiconductor manufacturing, it is conceivable to fabricate control circuits, memories, low-voltage circuits, and high-voltage circuits and the related devices in a single chip for decreasing costs and improving performance. And a MOS transistor device, being widely applied for enlarging currents or signals in a circuit or serving as an oscillator of a circuit, or serving as a switch device of a circuit, is further applied to be the high-power device or the high-voltage device based on the development of semiconductor processes. For example, a MOS transistor device, serving as a high-voltage device, is applied in between the internal circuits and the I/O terminals for preventing a large number of charges from suddenly spiking into the internal circuits and thus to avoid the resulted damage to the internal circuit. A MOS transistor, which serves as the high-voltage device, can be categorized into lateral-diffusion metal-oxide-semiconductor (LDMOS) and vertical double-diffusion metal-oxide-semiconductor (VDMOS).

A conventional LDMOS transistor device is positioned in a first conductive type substrate, such as a P-type substrate having a N-type well and a P-type formed therein. A drain region of the LDMOS transistor device is formed in the N-type well while a source region of the LDMOS transistor device is formed in the P-type well. And the source region and the drain region are horizontally adjacent to a gate structure of the LDMOS transistor device. Conventionally, the LDMOS transistor device further includes an N+ buried layer (NBL) positioned under the N-type well and the P-type well, which provides vertical electrical isolation for the P-type well.

When a voltage applied to the gate electrode is greater than the threshold voltage, the LDMOS transistor device is switched on. Then, the high-voltage signal inputted from the drain region is to flow to the N-type source doped region through the N-type well. In the meanwhile the N-type well positioned under the field oxide serves as a resistor, therefore the high-voltage signal passing through the N-type well is converted into a low-voltage signal favorable and useful for the internal circuits.

The conventional structure LDMOS transistor device is well suited for incorporation into VLSI processes because of its simplicity. However, the gate structure, the source region, the drain region, the N-type well, and the P-type well of the LDMOS transistor device require a specific size for providing sufficient robustness. Therefore the LDMOS transistor device often occupies the valuable spaces on the chip and adversely influences integrity level. In other words, the size of the resistor, that is the N-type well of the LDMOS transistor device, cannot be increased in accordance with increase of the external voltage due to the requirement for integrity. Furthermore, the LDMOS transistor device also faces a problem that the drain-source on-state resistance ($R_{dson}$) always raises with increase of device area.

SUMMARY OF THE INVENTION

It is therefore a primary objective of the present invention to provide a VDMOS transistor device capable of economizing utilizable chip area and improving integrity.

According to the claimed invention, a vertical double-diffusion metal-oxide-semiconductor (VDMOS) transistor device is provided. The VDMOS transistor device comprises a first conductive type semiconductor substrate having a first trench, a gate structure positioned in the first trench, a first conductive type well formed in the first conductive type semiconductor substrate and adjacent to the gate structure, a source region positioned in the first conductive type well and adjacent to the gate structure, a drain region positioned in the first conductive type semiconductor substrate and surrounding the source region, and a trench isolation structure positioned in a second trench between the source region and a portion of the drain region.

According to the VDMOS transistor device provided by the present invention, the trench isolation structure is used to electrically isolate the source region and a portion of the drain region, therefore high-voltage signals from the drain region have to detour around the trench isolation structure and thus to be converted into low-voltage signals that is favorable and useful to the internal circuits. Because the drain region, which serves as the resistor for generating voltage drop, is vertically positioned in the first conductive type semiconductor substrate, the resistor is no longer limited to the valuable area of the chip. Consequently, size of the resistor, which is a depth of a portion of the drain region, is adjustable according to the requirement of the external high-voltage signals. Therefore the VDMOS transistor device provided by the present invention can be extended according to the requirement of the external high-voltage signals without occupying the valuable area of the chip, and thus make itself more advantageous to the semiconductor industries nowadays.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
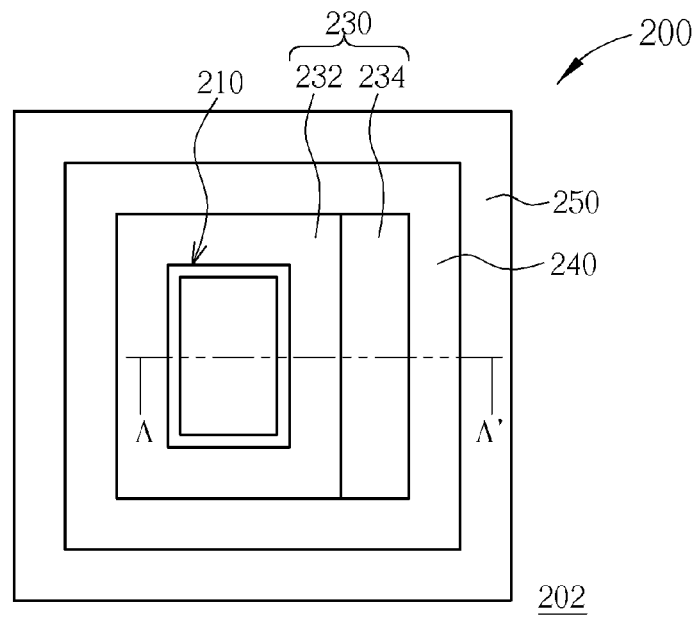
FIG. 1 is a top view of a VDMOS transistor device according to a preferred embodiment of the present invention.
Figure 2:
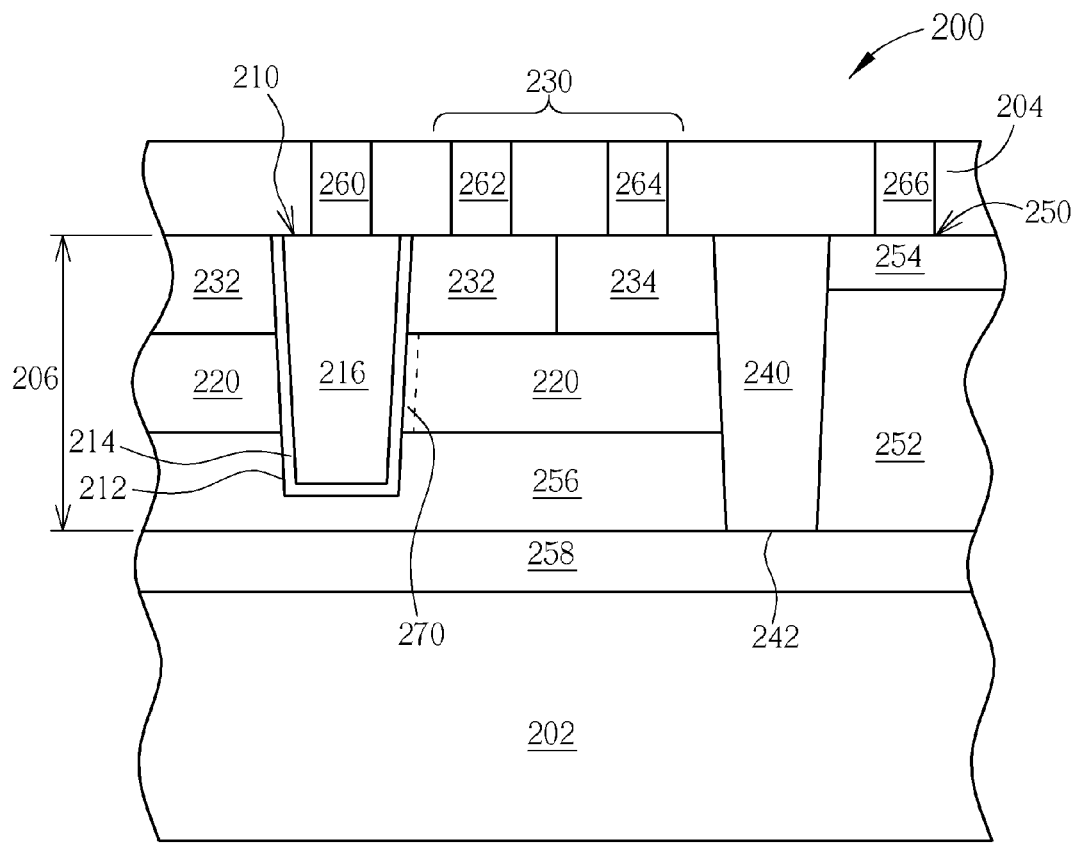
FIG. 2 is a cross-sectional view of the VDMOS transistor device taken along the line A-A' in FIG. 1.

Please refer to FIGS. 1-2. FIG. 1 is a top view of a VDMOS transistor device according to a preferred embodiment of the present invention; and FIG. 2 is a cross-sectional view of the VDMOS transistor device taken along the line A-A' in FIG. 1. For clarity, elements such as the dielectric layer and the contact plugs are omitted in FIG. 1.

Please refer to FIG. 1 and FIG. 2. The VDMOS transistor device 200 provided by the preferred embodiment comprises a first conductive type semiconductor substrate 202, such as a P-type semiconductor substrate, having a first trench 212 and a dielectric layer 204 formed thereon (shown in FIG. 2). The VDMOS transistor device 200 also comprises a gate structure 210 formed in the first trench 212. The gate structure 210 includes a gate dielectric layer 214 formed on surfaces of the sidewall and of the bottom of the first trench 212 and a gate conductive layer 216 filling the first trench 212. As shown in FIG. 2, the gate conductive layer 216 is electrically connected to an upper circuit by a contact plug 260 positioned in the dielectric layer 204.

The VDMOS transistor device 200 further comprises a first conductive type well 220 such as a P-type well formed in the first conductive type semiconductor substrate 200. The first conductive type well 220 surrounds and is adjacent to the gate structure 210 (shown in FIG. 2). And there is a source region 230 adjacent to the gate structure 210 formed in the first conductive type well 220. The VDMOS transistor device 200 unquestionably comprises a drain region 250 formed in the first conductive type semiconductor substrate 200. In the present preferred embodiment, the drain region 250 horizontally surrounds the source region 230 as shown in FIG. 1. It is noteworthy that the VDMOS transistor device 200 of the preferred embodiment further comprises a trench isolation structure 240 positioned in a second trench 242 between the source region 230 and a portion of the drain region 250 for horizontally providing an electrical isolation between the source region 230 and the portion of the drain region 250. Furthermore, in the present preferred embodiment as shown in FIG. 1, the trench isolation structure 240 is an annular structure and horizontally surrounds the source region 230. Although the a depth of the first trench 212 is different from a depth of the trench isolation structure 240, in a modification of the present preferred embodiment, it is not limited that the depths of the first trench 212 and the trench isolation structure 240 are similar.

Additionally, the VDMOS transistor device 200 provided by the present preferred embodiment can comprise a first conductive type epitaxial layer 206, such as a P-type epitaxial layer (P-Epi layer). And the portion of the drain region 250, the first conductive type well 220, and the source region 230 formed in the first conductive type well 220 are all formed in the first conductive type epitaxial layer 206.

Please still refer to FIG. 2. The source region 230 of the VDMOS transistor device 200 comprises a heavily doped source region 232 adjacent to the gate structure 210. The heavily doped source region 232 is a second conductive type heavily doped region such as an N-type heavily doped region and is electrically connected to the upper circuit by a contact plug 262 positioned in the dielectric layer 204. The source region 230 further comprises a first conductive type heavily doped region 234 formed in the first conductive type well 220 and between the heavily doped source region 232 and the trench isolation structure 240. The first conductive type heavily doped region 234 is electrically connected to the first conductive type well 220 that serves as a body of the VDMOS transistor device 200. And the first conductive type heavily doped region 234 is electrically connected to the upper circuit by a contact plug 264 positioned in the dielectric layer 204. It is noteworthy that the first conductive type heavily doped region 234 and the heavily doped source region 232 are electrically connected to a same voltage by contact plugs 264, 262, respectively.

Please refer to FIG. 2 again. The drain region 250 of the VDMOS transistor device 200 comprises a second conductive type well 252, such as an N-type well. A depth of the second conductive type well 252 is substantially equal to a depth of the trench isolation structure 240. The drain region 250 further comprises a heavily doped drain region 254 formed in the second conductive type well 252. And the heavily doped drain region 254 is a second conductive type heavily doped region such as an N-type heavily doped region. The second conductive type well 252 and the heavily doped drain region 254 are positioned in a side of the trench isolation structure 240 opposite to the source region 234. When the trench isolation structure 240 is an annular structure, the second conductive type well 252 and the heavily doped drain region 254 are positioned outside of the annular trench isolation structure 240. In other words, the annular trench isolation structure 240 horizontally provides an electrical isolation between the drain region 230 and a portion of the drain region 250 that is the second conductive type well 252 and the heavily doped drain region 254. The heavily doped drain region 254 is electrically connected to the upper circuit by a contact plug 266 positioned in the dielectric layer 204. The drain region 250 further comprises a lightly doped drain region 256 adjacent to the gate structure 210. The lightly doped drain region 256 and the source region 230 are positioned in a same side of the trench isolation structure 240 while the lightly doped drain region 256 is formed underneath the source region 230. When the trench isolation structure 240 is an annular structure, the lightly doped drain region 256 is positioned inside of the trench isolation structure 240. As shown in FIG. 2, the first conductive type well 220 serving as the body of the VDMOS transistor device 200 is formed in between the lightly doped drain region 256 and the source region 230, and vertically isolates the lightly doped drain region 256 and the source region 230. The second conductive type well 252 and the heavily doped drain region 254 that are positioned outside of the annular trench isolation structure 240 are electrically connected to the lightly doped drain region 256 that is positioned inside of the annular trench isolation structure 240 by a second conductive type buried layer 258, such as an N-type buried layer (NBL).

When a voltage applied to the gate electrode 216 is greater than the threshold voltage, the VDMOS transistor device 200 is switched on, and a channel region 270 is formed in the first conductive type well 220 surrounding the gate structure 210 and adjacent to the gate dielectric layer 214. Because the annular trench isolation structure 240 electrically isolates the source region 230 and a portion of the drain region 250, the high-voltage signals are to flow through the drain region 250 having the heavily doped drain region 254, the second conductive type well 252, the NBL 258, and the lightly doped drain region 256 that form aj-shape drain region 250. And the high-voltage signals will pass to the source region 230 through the J-shape drain region 250 by detouring under the trench isolation structure 240, passing the channel region 270 that is substantially perpendicular both to the source region 230 and the portion of the drain region 250, and then passing to the source region 230. To prevent a punch-through effect from happening between the source region 230 and the drain region 250, particularly between the heavily doped source region 232 and the lightly doped drain region 256, at least a grade region (not shown) having a same conductive type with the heavily doped source region 232, such as an N-type, can be formed in between the heavily doped source region 232 and the first conductive type well 220 while another grade region (not shown) having a same conductive type with the lightly doped drain region 256 such as an N-type can be formed in between the lightly doped drain region 256 and the first conductive type well 220 in other modification, but the present invention is not limited to this.

According to the VDMOS transistor device 200 provided by the present invention, the second conductive type well 252 positioned outside of the trench isolation structure 240 serves as a resistor. Even the NBL 258 positioned under the trench isolation structure 240 and the lightly doped drain region 256 positioned inside of the trench isolation structure 240 serve as the resistor, therefore the high-voltage signals passing through the drain region 250 will be effectively converted into low-voltage signals favorable and useful to the internal circuits. Because the second conductive type well 252 is vertically positioned in the first conductive type semiconductor substrate 202, the resistor for generating voltage drop is no longer limited to the valuable area of the chip. Consequently, size of the resistor, which is a depth and a doping concentration of the second conductive type well 252, is adjustable according to the requirement of the external high-voltage signals. Therefore the VDMOS transistor device provided by the present invention can be extended according to the requirement of the external high-voltage signals without occupying the valuable area of the chip, and thus make itself more advantageous to the semiconductor industries nowadays.

Those skilled in the art will readily observe that numerous modifications and alterations of the device and method may be made while retaining the teachings of the invention.

What is claimed is:

1. A vertical double-diffusion metal-oxide-semiconductor (VDMOS) transistor device comprising:
    a first conductive type semiconductor substrate having a first trench;
    a gate structure positioned in the first trench;
    a first conductive type well formed in the first conductive type semiconductor substrate and adjacent to the gate structure;
    a source region positioned in the first conductive type well and adjacent to the gate structure;
    a drain region positioned in the first conductive type semiconductor substrate and surrounding the source region; and
    a trench isolation structure positioned in a second trench between the source region and a portion of the drain region.

2. The VDMOS transistor device of claim 1, wherein the trench isolation structure horizontally provides an electrical isolation between the source region and a portion of the drain region.

3. The VDMOS transistor device of claim 2, wherein the trench isolation structure is an annular structure.

4. The VDMOS transistor device of claim 1, further comprising a first conductive type epitaxial layer.

5. The VDMOS transistor device of claim 4, wherein the source region, the first conductive type well, and a portion of the drain region are positioned in the first conductive type epitaxial layer.

6. The VDMOS transistor device of claim 1, wherein the source region further comprises a heavily doped source region adjacent to the gate structure.

7. The VDMOS transistor device of claim 6, further comprising a first conductive type heavily doped region positioned in the first conductive type well, and positioned between the heavily doped source region and the trench isolation structure.

8. The VDMOS transistor device of claim 7, wherein the first conductive type heavily doped region and the heavily doped source region are electrically connected to a same voltage.

9. The VDMOS transistor device of claim 1, wherein the drain region further comprises:
    a second conductive type well and a heavily doped drain region formed therein, the second conductive type well and the heavily doped drain region being positioned in a side of the trench isolation structure opposite to the source region;
    a lightly doped drain region adjacent to the gate structure, the lightly doped drain region and the source region being positioned in a same side of the trench isolation structure; and
    a second conductive type buried layer electrically connecting the second conductive type well and the lightly doped drain region.

10. The VDMOS transistor device of claim 9, wherein the lightly doped drain region is positioned underneath the source region.

11. The VDMOS transistor device of claim 10, wherein the first conductive type well vertically isolates the lightly doped drain region and the source region.

12. The VDMOS transistor device of claim 1, wherein the gate structure further comprises:
    a gate dielectric layer formed on surfaces of a sidewall and of a bottom of the first trench; and
    a gate conductive layer filling the first trench.

13. The VDMOS transistor device of claim 1, wherein the first conductive type is P-type and the second conductive type is N-type.

* * * * *